US006916697B2

United States Patent
Zhu et al.

(10) Patent No.: US 6,916,697 B2
(45) Date of Patent: Jul. 12, 2005

(54) ETCH BACK PROCESS USING NITROUS OXIDE

(75) Inventors: Helen Zhu, Fremont, CA (US); Rao Annapragada, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/680,894

(22) Filed: Oct. 8, 2003

(65) Prior Publication Data

US 2005/0079704 A1 Apr. 14, 2005

(51) Int. Cl.⁷ .......................................... H01L 21/8238
(52) U.S. Cl. ...................... 438/212; 438/710; 438/711; 438/780
(58) Field of Search .................. 438/212, 710, 438/711, 780

(56) References Cited

U.S. PATENT DOCUMENTS

| | | | |
|---|---|---|---|
| 5,783,493 A | * | 7/1998 | Yeh et al. .................... 438/718 |
| 5,970,376 A | * | 10/1999 | Chen ........................... 438/637 |
| 6,413,877 B1 | | 7/2002 | Annapragada |
| 6,498,112 B1 | | 12/2002 | Martin et al. |
| 6,521,539 B1 | * | 2/2003 | Zhou et al. .................. 438/706 |
| 6,617,257 B2 | * | 9/2003 | Ni et al. ...................... 438/725 |
| 2002/0111041 A1 | | 8/2002 | Annapragada et al. |
| 2002/0182881 A1 | * | 12/2002 | Ni et al. ...................... 438/725 |
| 2004/0038540 A1 | * | 2/2004 | Li et al. ...................... 438/700 |

* cited by examiner

*Primary Examiner*—George Fourson
*Assistant Examiner*—Michelle Estrada
(74) *Attorney, Agent, or Firm*—Michael A. Kerr; Virtual Legal, P.C.

(57) ABSTRACT

A method for generating an organic plug within a via is described. The via resides in an integrated circuit (IC) structure having a silicon containing dielectric material. The method for generating the organic plug includes applying an organic compound such as a bottom antireflective coating. The organic compound occupies the via. The method then proceeds to feed a nitrous oxide ($N_2O$) gas into a reactor and generates a plasma in the reactor. A significant portion of the organic compound is removed leaving behind an organic plug to occupy the via. The organic plug is typically generated during dual damascene processing.

19 Claims, 7 Drawing Sheets

ETCH BACK PROCESS USING NITROUS OXIDE

RELATED APPPLICATIONS

This patent application is related to commonly assigned U.S. patent application Ser. No. 10/680,895 entitled A NITROUS OXIDE STRIPPING PROCESS FOR ORGANOSILICATE GLASS, by Rao Annapragada et al., filed concurrently herewith and incorporated herein by reference.

BACKGROUND

1. Field of Invention

The present invention relates to semiconductor manufacturing. More particularly, the invention relates to the generation of an organic plug for an IC structure.

2. Description of Related Art

In semiconductor integrated circuit (IC) fabrication, devices such as component transistors are formed on a semiconductor wafer substrate that is typically made of silicon. During the fabrication process, various materials are deposited on the different layers in order to build a desired IC. Typically, conductive layers may include patterned metallization lines, polysilicon transistor gates and the like which are insulated from one another with dielectric materials. The dielectric materials have been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitances.

In general, the coupling capacitance in an integrated circuit is directly proportional to the dielectric constant, k, of the material used to form the dielectric layers. As noted above, the dielectric layers in prior art integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

One particular material that is being used as a low-k dielectric is organosilicate glass (OSG). OSG is a low-k material that can be deposited either by spin-on or CVD methods. The typical OSG k value ranges from 2.6 to 2.8. Porous OSG (pOSG) can also be used for low-k applications. Typically, porous materials such as pOSG are applied using spin-on methods and with controlled evaporation of the solvent providing the desired pore structure.

Typically, low-k materials are incorporated into IC fabrication using a copper dual damascene process. A dual damascene structure employs an etching process that creates trenches for lines and holes for vias. The vias and trenches are then metallized to form the interconnect wiring. The two well-known dual damascene schemes are referred to as a via first sequence and a trench first sequence.

During the dual damascene process, the via should be protected from faceting and fence formation. To protect the via from these problems, an organic plug is used. The process of generating the organic plug should have little or no effect on an IC structure. Thus, for an IC structure having an OSG dielectric material, the generation of the organic plug should have little or no effect on the OSG layer.

SUMMARY

A method for generating an organic plug within a via is described. The via resides in an integrated circuit (IC) structure having a silicon based dielectric material. In the illustrative example, the via resides in an IC structure having a first photoresist layer, a second intermediate layer, and a third organosilicate glass (OSG) layer. The second intermediate layer may include a cap layer or a hardmask layer.

The method for generating the organic plug includes applying an organic compound such as a bottom antireflective coating (BARC) to the IC structure. The organic compound occupies the via. The method then proceeds to feed a nitrous oxide ($N_2O$) gas into a reactor and generates a plasma in the reactor. A significant portion of the organic compound is removed leaving behind an organic plug to occupy the via. The process of removing the organic compound is also referred to as the "etch back" process. To control the removal of the organic material, concentrations of $N_2O$ gas that result in controlled ash rates are used. Additionally, a diluent such as a noble gas may be used with the $N_2O$ gas to further achieve the desired etch rate.

The organic plug may be generated in the same reactor used for etching and/or stripping the IC structure. The organic plug is typically generated during dual damascene processing including via-first dual damascene process and trench-first dual damascene processes.

BRIEF DESCRIPTION OF THE DRAWINGS

Illustrative embodiments of the present invention are shown in the accompanying drawings wherein.

DETAILED DESCRIPTION

In the following detailed description, reference is made to the accompanying drawings, which form a part hereof, and which is shown by specific embodiments. These embodiments are described in sufficient detail to enable those skilled in the art to practice the invention, and it is to be understood that other embodiments may be utilized and that structural, logical and electrical changes may be made without departing from the spirit and scope of the claims. The following detailed description is, therefore, not to be taken in a limited sense. Note, the leading digit(s) of the reference numbers in the Figures correspond to the figure number, with the exception that identical components which appear in multiple figures are identified by the same reference numbers.

Figure 1:
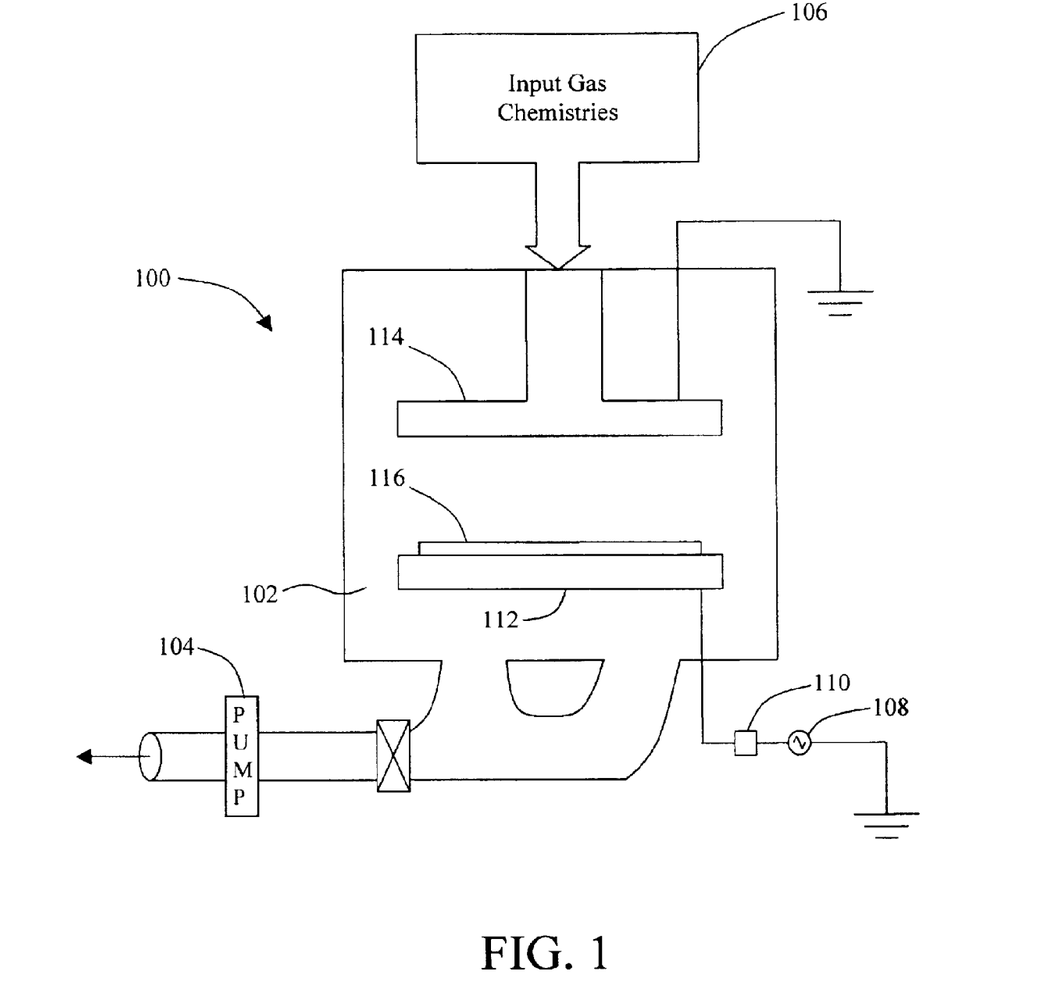
FIG. 1 is an illustrative apparatus capable of removing a photoresist from an IC structure having a photoresist layer and an OSG layer.

Referring to FIG. 1 there is shown an illustrative system for performing the etch back process with an IC structure having an OSG layer. The illustrative system is also configured to perform hard mask etching and dielectric etching. The illustrative system is a parallel plate plasma system 100 such as a 200 mm EXELAN HPT system available from Lam Research Corporation from Fremont, Calif. Additionally, other systems from Lam such as the EXELAN 2300 series may also be used. The system 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched and/or stripped with plasma generated by energizing the gasses into a plasma state. Other capacitively coupled reactors can also be used such as reactors where RF power is supplied to both electrodes such as the dual frequency plasma etch reactor described in commonly owned U.S. Pat. No. 6,090,304, the disclosure of which is hereby incorporated by reference.

Alternatively, the plasma can be produced in various other types of plasma reactors referred to as inductively coupled plasma reactor, an electron-cyclotron resonance (ECR) plasma reactor, a helicon plasma reactor, or the like. Such plasma reactors typically have energy sources which use RF energy, microwave energy, magnetic fields, etc. to produce a medium to high density plasma. For instance, a high density plasma could be produced in a Transformer Coupled Plasma etch reactor available from Lam Research Corporation which is also called an inductively coupled plasma reactor.

Figure 2:
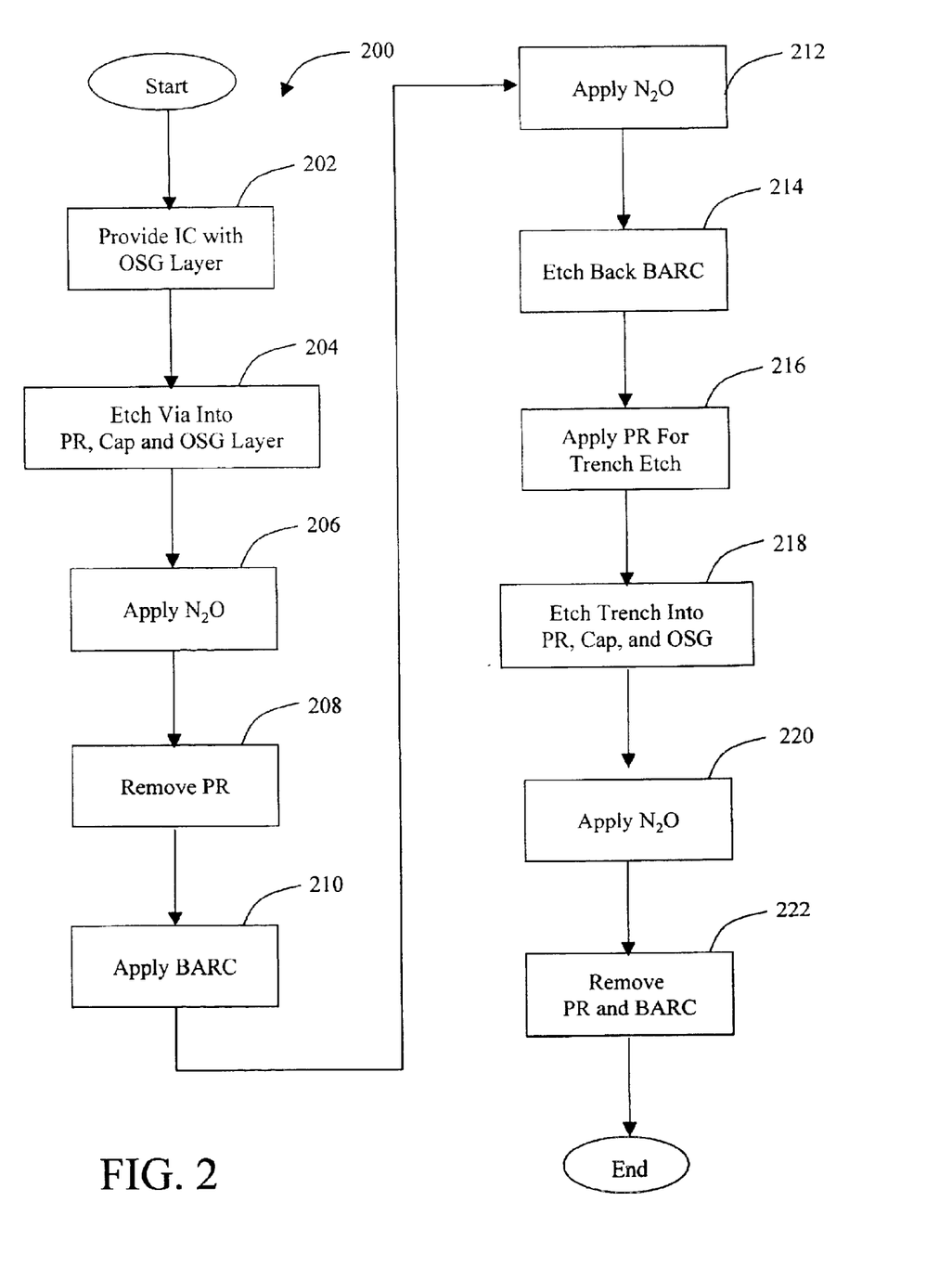
FIG. 2 is a flowchart for stripping photoresist in a via first dual damascene process.

Referring to FIG. 2 there is shown a flowchart for stripping a photoresist in a via first dual damascene process. The stripping process includes a method for generating an organic plug within a silicon containing dielectric material. In the illustrative example the silicon containing dielectric material is an OSG layer. The illustrative IC structure includes a first organic photoresist layer, a second intermediate layer, a third OSG layer, and a fourth barrier layer. By way of example and not of limitation, the photoresist layer is an organic photoresist such as the 193 nm photoresist or 248 nm photoresist from the Shipley Company. The illustrative second intermediate layer is a cap layer composed of such cap materials as Silicon Dioxide ($SiO_2$), Silicon Oxynitride (SiON), and any other such silicon and oxygen containing materials. The cap layer provides protection to the OSG layer during the reworking of the photoresist layer. The third layer is an OSG layer and may include materials such as CORAL™ from Novellus Systems of San Jose, Calif., and BLACK DIAMOND™ from Applied Materials of Santa Clara, Calif., or any other such OSG materials. Additionally, it shall be appreciated by those skilled in the art that the OSG material may also be a porous OSG (pOSG) material. By way of example and not of limitation, the pOSG may have a void space of greater than 30%. The illustrative fourth barrier layer is composed of such barrier materials as silicon nitride ($Si_3N_4$), silicon carbide (SiC), or any other such silicon based material. The barrier layer provides protection from copper diffusion.

The flowchart in FIG. 2 describes the method 200 for performing a via first etch sequence in which a via is etched into the IC structure where the second intermediate layer is a cap layer. As previously mentioned, the method includes the generation of an organic plug to protect the via. The method is initiated at process block 202 in which the IC structure is positioned in the illustrative reactor 100. The IC structure includes a via patterned photoresist layer. Those skilled in the art shall appreciate that the generation of a patterned via or trench presumes completing the photolithography on the first photoresist layer. As is well known in the art, photolithography uses a light sensitive photoresist that is baked and exposed to a controlled light source. The light passes through a reticle that transfers the desired pattern.

At block 204 a via is etched into the second cap layer, and the third OSG layer. By way of example and not of limitation, the via is etched up to the barrier layer. At block 206, $N_2O$ is added to the reaction chamber and a plasma is generated. At block 208, the plasma strips the photoresist from the IC structure and generates a volatile by-product such as carbon dioxide ($CO_2$). A more detailed discussion about the method for stripping the photoresist is provided in the patent application titled "A NITROUS OXIDE STRIPPING PROCESS FOR ORGANOSILICATE GLASS" which is being filed concurrently herewith and which is hereby incorporated by reference.

The method then generates an organic plug for the via. The organic plug is used to prevent via faceting and to preserve the barrier layer during the trench etch process. At process block 210, the organic plug is generated by applying an organic material using an organic spin-on technique. By way of example and not of limitation, the organic material is a bottom antireflective coating (BARC). Alternatively, the organic material may be an antireflective coating (ARC). The illustrative organic BARC and ARC is designed to absorb light.

At block 212, $N_2O$ is added to the illustrative reactor 100 using the illustrative process parameters described below. At block 214, the $N_2O$ gas is energized and the BARC or organic material is etched back to produce the desired "organic plug". By way of example and not of limitation, the organic plug has a plug height that is either equal to the desired trench height, or exceeds the desired trench height. The plug height needs to be of sufficient height to prevent fence formation and to prevent via faceting.

It shall be appreciated by those skilled in the art having the benefit of this disclosure that, although the illustrative example describes generating an organic plug within the OSG layer, the organic plug can be generated in other well-known silicon containing dielectric materials such as silicon dioxide ($SiO_2$), fluorinated silicate glass (FSG), and other such silicon containing dielectric materials. Furthermore, those skilled in the art having the benefit of this disclosure will appreciate that the illustrative intermediate cap layer is not required to effectively generate the organic plug.

In a rather broad embodiment, the range for the processing parameters may be practiced at operating pressures of 10–1000 mTorr, at power ranges of 0 to 1000 W for RF power, and at $N_2O$ flow rates of 50–2000 sccm. In a less broad embodiment having a RF source configured to supply RF power at 27 MHz and 2 MHz or more, the range for the processing parameters may be practiced at operating pressures of 50–600 mTorr, at 50–200 W for 27 MHz RF power, at 50–200 W for 2 MHz RF power, and at $N_2O$ flow rates of 150–1000 sccm. In an even less broad embodiment that is applied to a 200 mm wafer or substrate, the range for the processing parameters may be practiced at operating pressures of 100–350 mTorr, at 100–150 W for 27 MHz RF power, at 100–150 W for 2 MHz RF power, and at $N_2O$ flow rates of 100–500 sccm. Additionally, an inert gas may be used as a diluent for each of the embodiments described. By way of example and not of limitation, the inert gas may include noble gases such as Argon, Helium, Neon, Krypton, and Xeon. The inert gas may be used to control the etch rate for the organic plug.

A plurality of different process parameters for using $N_2O$ to etch back the illustrative organic BARC with illustrative system 100 is shown in Table 1. The organic ash rate in Table 1 is for an organic photoresist. However, those skilled in the art shall appreciate that the illustrative BARC ash rate would be similar to the strip rate for a photoresist.

TABLE 1

Illustrative Process Parameter
For Stripping Organic Compound with $N_2O$

| Run # | Pressure (mTorr) | 27 MHz RF Power (W) | 2 MHz RF Power (W) | $N_2O$ Flow Rate (sccm) | Organic Ash Rate (Å/min) |
|---|---|---|---|---|---|
| 1 | 350 | 100 | 100 | 900 | 2960 |
| 2 | 100 | 100 | 100 | 300 | 3451 |
| 3 | 100 | 100 | 200 | 900 | 4655 |
| 4 | 100 | 200 | 100 | 900 | 4857 |
| 5 | 225 | 150 | 150 | 600 | 5628 |
| 6 | 350 | 200 | 100 | 300 | 5779 |
| 7 | 350 | 100 | 200 | 300 | 6091 |
| 8 | 100 | 200 | 200 | 300 | 6735 |
| 9 | 350 | 200 | 200 | 900 | 7895 |

In Table 1, the process parameters for a number of different "runs" are shown. The runs were performed on a 200 mm wafer at 20° C. During each run the pressure, power and $N_2O$ flow rate are adjusted. The resulting organic ash strip rate is shown at the far right of Table 1.

It shall be appreciated by those skilled in the art that the optimal flow rates and ratios for the illustrative gas mixture of Table 1 may change depending on the type of plasma etch chamber, the substrate size, and other such variables that are well known to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation.

For purposes of removing a portion of the illustrative BARC, it is generally desirable to achieve low ash rates for the stripping of the BARC. The lower ash rates permit greater control of the plug height. In the illustrative embodiment, the plug height is controlled so that the plug height is below the OSG/intermediate layer interface. Thus, unlike the photoresist etch rate process, the etch back process typically has lower strip rates than those corresponding to the photoresist stripping process. There is a high selectivity between the organic plug material layer and the second cap layer.

At block 216, another photoresist layer is applied. The photoresist is patterned for the trench etch sequence. The method then proceeds to block 218 in which a trench is etched into the second cap layer and the third OSG layer. At block 220, $N_2O$ is again applied. At block 222, the $N_2O$ is energized and the organic plug and the photoresist layer are both removed. The $N_2O$ is applied and energized according to the process parameters described in the patent application identified in the patent application titled "A NITROUS OXIDE STRIPPING PROCESS FOR ORGANOSILICATE GLASS" which is being filed concurrently herewith and which is hereby incorporated by reference.

Referring to Table 2, there is shown the $N_2O$ strip process being compared to a variety of other gases that may be used during the etch back process. By way of example and not of limitation, the other gases or gas mixtures include ammonia ($NH_3$), oxygen ($O_2$), and the nitrogen and hydrogen ($N_2/H_2$) gas mixture. During the comparison of the gasses a Fourier Transform Infrared (FTIR) spectrophotometer was used to detect changes in an illustrative OSG material. For the comparison, a blanket CORAL™ wafer was used as the illustrative OSG material. During the experiment, the CORAL™ wafer was exposed to different gasses to determine changes in the ratio of the Si—C peak to the SiO peak. The Si—C and SiO peaks indicate changes to the OSG material.

TABLE 2

Comparison of Various Gases

| Gas Mixture | Flow Rate (sccm) | Pressure (mTorr) | 27 MHz RF Power (W) | 2 MHz RF Power (W) | Strip Rate (Å/min) | Change in SiC/SiO Ratio |
|---|---|---|---|---|---|---|
| $N_2O$ | 300 | 350 | 200 | 100 | 5779 | 1.8% |
| $NH_3$ | 1500 | 350 | 600 | 0 | 5470 | 2.5% |
| $O_2$ | 1000 | 330 | 200 | 100 | 10595 | 4.1% |
| $N_2/H_2$ | 1900 ($N_2$) 600 ($H_2$) | 470 | 400 | 400 | 4150 | 5.0% |

Table 2 shows that the $N_2O$ results in the lowest change in the SiC/SiO ratio which indicates that the OSG material is affected least by the $N_2O$ stripping. Notice that the $N_2O$ strip rate is comparable to the $NH_3$ strip rate, however $N_2O$ stripping operates with significantly lower power demands than $NH_3$ stripping. Additionally, $N_2O$ stripping may avoid the particle generation associated with $NH_3$ stripping. Furthermore as shown in Table 2, the $N_2O$ stripping process is a milder oxidant than $O_2$ which results in less oxidation of the OSG material. Less oxidation of the OSG material is desirable because oxidation raises the k value of the OSG materials.

Figure 3A:
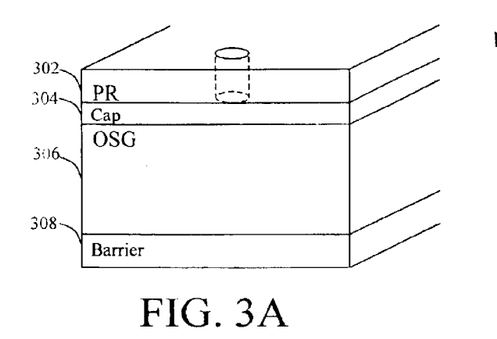
FIG. 3A through FIG. 3H is an isometric view of the via etch and strip sequence of the flowchart in FIG. 2.
Figure 3B:
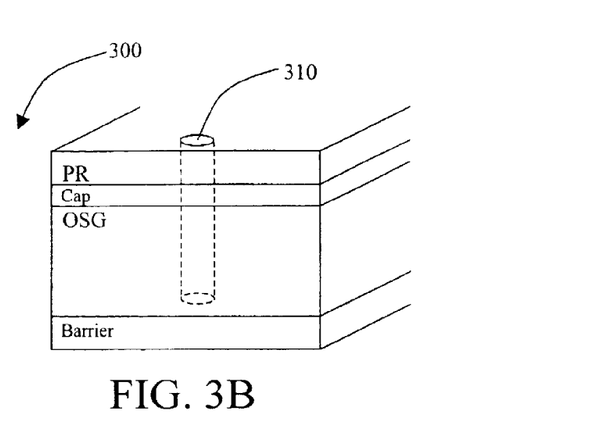

Referring to FIG. 3A through FIG. 3H there is shown an isometric view of the via etch and strip sequence of the flowchart in FIG. 2. FIG. 3A shows an isometric view of the illustrative IC structure having a first organic photoresist 302, a second intermediate cap layer 304, a third OSG layer 306, and a fourth barrier layer 308. As described above, the illustrative IC structure is positioned in the illustrative reactor 100. FIG. 3B shows the illustrative IC structure after performing the via first etch in process 204 where the via 310 is etched into the second cap layer 304 and the third OSG layer 306.

Figure 3C:
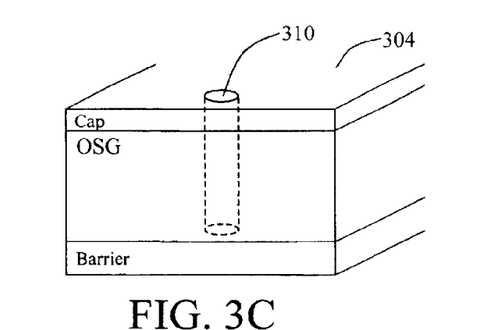

In FIG. 3C there is shown the illustrative IC structure after having added the $N_2O$ from process 206, and stripping the photoresist layer 302 from process 308. The remaining IC structure includes inter alia the visible cap layer 304 and the via 310.

Figure 3D:
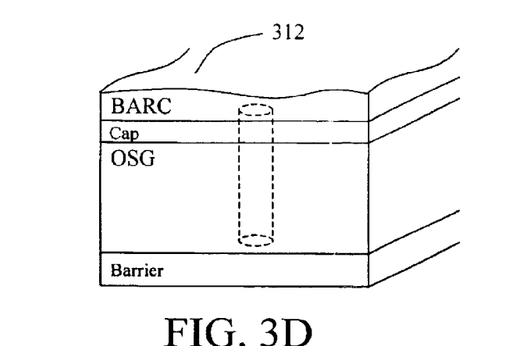
Figure 3E:
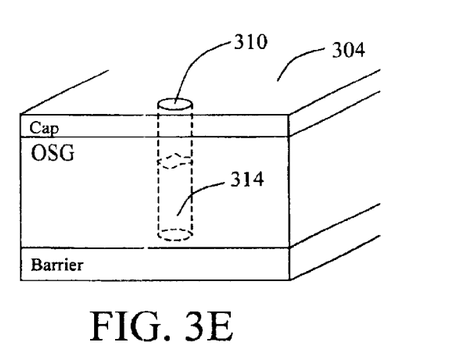
Figure 3F:
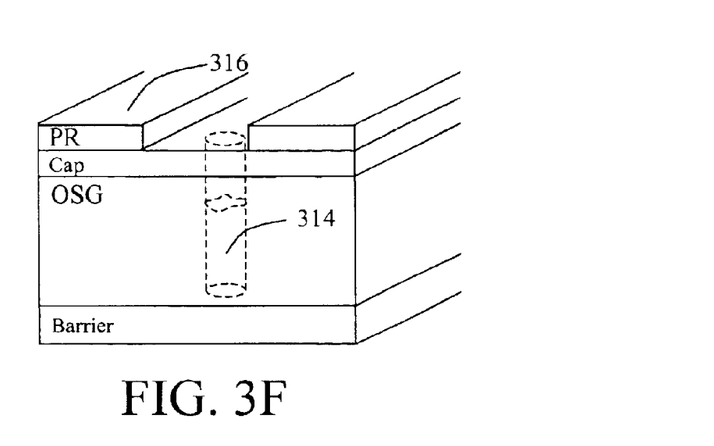

Referring to FIG. 3D there is shown the illustrative IC structure after adding an organic material such as BARC 312 as described in process block 210. In FIG. 3E, an organic plug 314 is shown within the via 310. The organic plug 314 is generated by applying $N_2O$ and then etching back the organic plug 314 as described in block 212 and block 214. In FIG. 3F, the IC structure is shown after adding a layer of photoresist 316 as described in block 216. The photoresist 316 is patterned for trench etching.

Figure 3G:
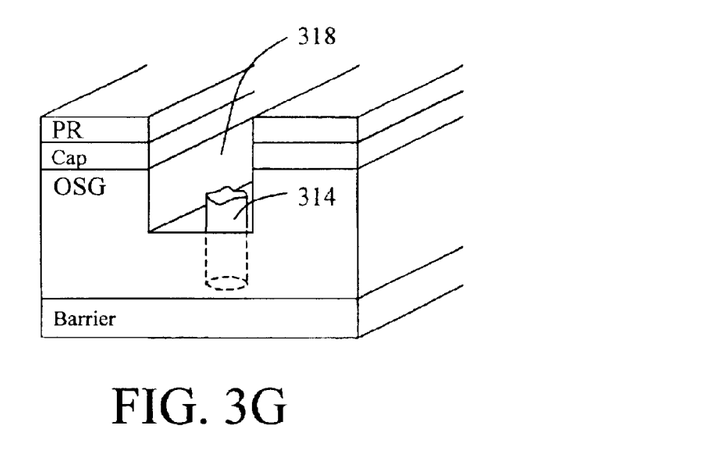
Figure 3H:
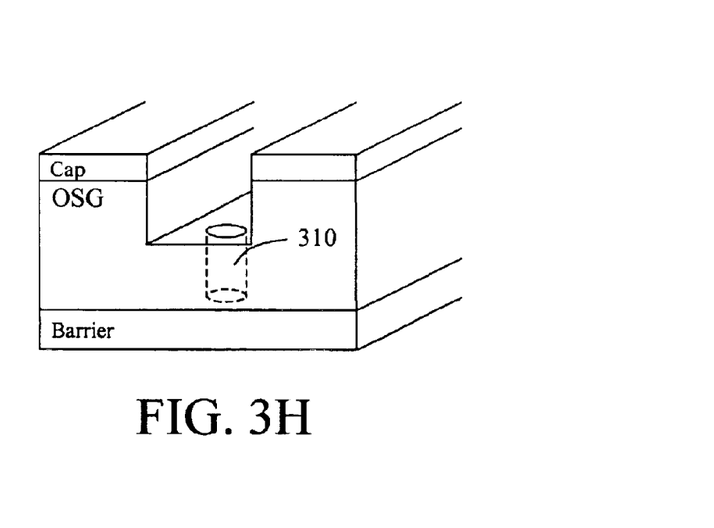

The trench 318 is then etched as shown in FIG. 3G according to the trench etch process 218. The trench 318 is etched into the second cap layer and the third OSG layer. The organic plug 314 prevents the faceting of the via 310. At FIG. 3H, the IC structure is shown after stripping the photoresist and the organic plug using the $N_2O$ strip process described in block 220 and block 222. Note, that the ash rate during the removal of the organic plug does not have to be as controlled as the ash rate during the etch back process. By way of example and not of limitation, control is established by having lower etch rate.

Figure 4:
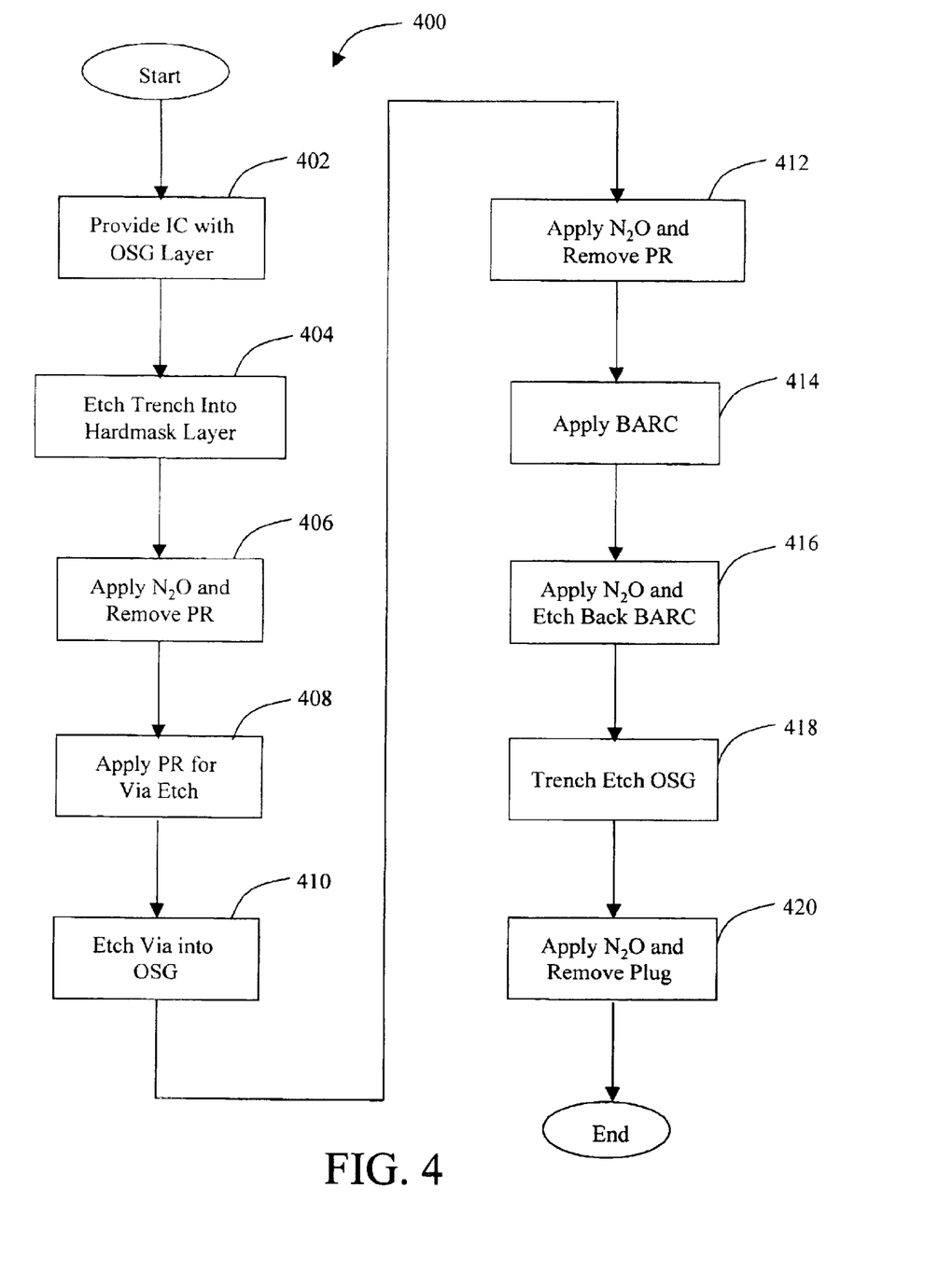
FIG. 4 is a flowchart for stripping photoresist in a trench first dual damascene process.

Referring to FIG. 4 there is shown a flowchart for a method of stripping a photoresist in a trench first dual damascene process. The photoresist is applied to an IC structure that includes silicon containing dielectric material such as an OSG layer. The illustrative IC structure includes a first organic photoresist layer, a second intermediate layer, a third OSG layer, and a fourth barrier layer. The photoresist layer is an organic photoresist as described above. The illustrative second intermediate layer is a hardmask layer composed of such hardmask materials as silicon nitride ($Si_3N_4$), tantalum nitride (TaN), titanium nitride (TiN), or silicon carbide (SiC). The hardmask material is used instead of a cap layer because the IC structure is directly exposed to plasma during the etching process without the benefit of a photoresist. The third layer is an OSG layer such as CORAL™, and BLACK DIAMOND™ or any other such silicon containing dielectric material. Additionally, the OSG material may also be a porous OSG (pOSG) material as described above. The illustrative fourth barrier layer is composed of such barrier materials as silicon nitride ($Si_3N_4$), or silicon carbide (SiC) as described above.

The flowchart in FIG. 4 describes the method 400 for performing a trench etch in the illustrative structure having an intermediate hardmask layer. The method is initiated at process block 402 in which the illustrative IC structure having a trench patterned into the photoresist layer is positioned in the illustrative reactor 100. The method then proceeds to process step 404 in which a trench is etched into the second intermediate hardmask layer.

At process block 406, $N_2O$ is added to the reaction chamber and a plasma is generated. The operating parameters for the removal of the photoresist are similar to those described above. The plasma strips the photoresist from the structure and generates a volatile by-product such as $CO_2$. There is a high selectivity between the first photoresist layer and the second hardmask layer. Additionally, there is a high selectivity between the first photoresist layer and the third OSG layer.

At process block 408, another first photoresist layer is added to the IC structure. This other photoresist layer is patterned for via etching. At block 410, a via is then etched into the second hardmask layer, and the third OSG layer. It shall be appreciated by those of ordinary skill in the art that the gases and process parameters used for via etching are dependent on a variety of parameters such as the type of hardmask material, and OSG materials.

At block 412, $N_2O$ is again applied to illustrative system 100 using the process parameters that are described above. The plasma is then formed when the $N_2O$ is energized and the via patterned photoresist layer is then stripped with the $N_2O$ plasma.

The method then proceeds to generate an organic plug for the via. At block 414, the organic plug is generated by first applying an organic material such as BARC or ARC as described above. At block 416, $N_2O$ is used to etch back the BARC or ARC to produce the desired organic plug as described above.

At block 418, the previously etched trench pattern in the hardmask layer is used to trench etch the third OSG layer. As previously noted, the gases and process parameters for performing the trench etch are dependent on such parameters as the IC structure such as the hardmask material and OSG materials. Finally, at block 420, a $N_2O$ plasma is used to remove the organic plug. Note, that the ash rate during the removal of the organic plug does not have to be as controlled as the ash rate during the etch back process. By way of example and not of limitation, control is established by having lower etch rate during the etch back process.

Figure 5A:
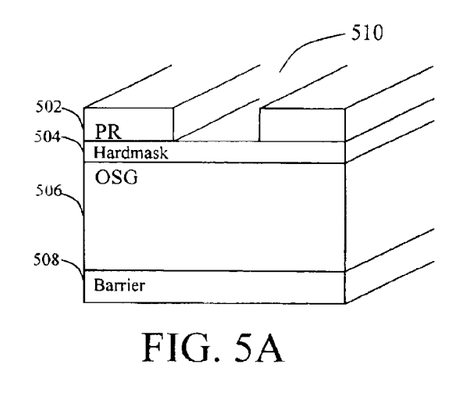
FIG. 5A through FIG. 5J is an isometric view of the trench etch and strip sequence of the flowchart in FIG. 4.
Figure 5B:
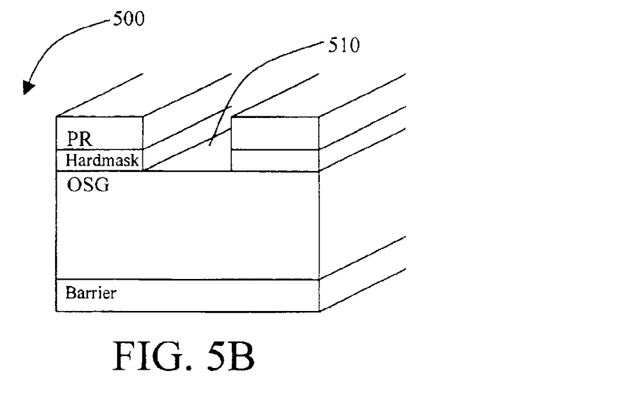

Referring to FIG. 5A through FIG. 5J there is shown an isometric view of the trench etch and strip sequence 500 described in the flowchart in FIG. 4. FIG. 5A shows an isometric view of the illustrative IC structure having a first organic photoresist layer 502, a second intermediate hardmask layer 504, a third OSG layer 506, and a fourth barrier layer 508. The first organic photoresist layer has a trench 510 patterned into the photoresist layer. As described above, the illustrative IC structure is positioned in the illustrative reactor 100. FIG. 5B shows the illustrative IC structure after performing the process 404 in which the trench 510 is etched into the second hardmask layer 504.

Figure 5C:
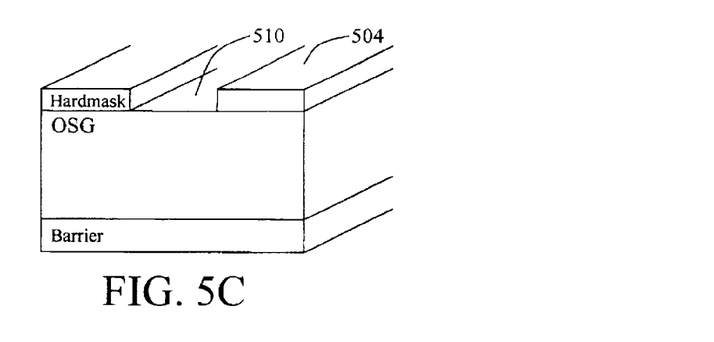

In FIG. 5C there is shown the illustrative IC structure after having added the $N_2O$ from process 406 to chamber 100. The $N_2O$ is converted to a plasma that strips the photoresist layer 502 and leaves the trench etched hardmask layer 504.

Figure 5D:
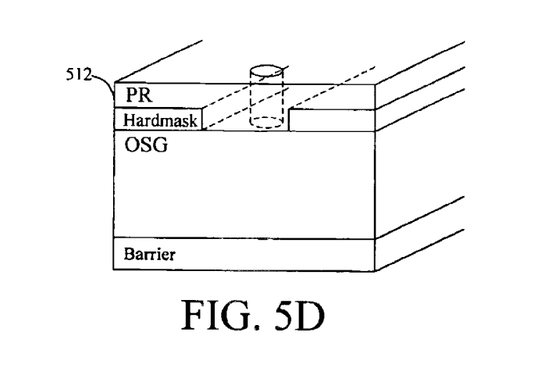
Figure 5E:
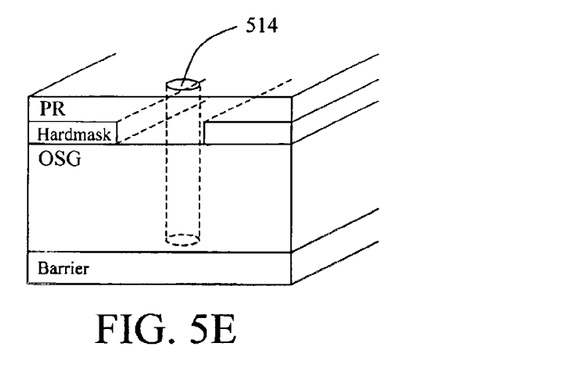
Figure 5F:
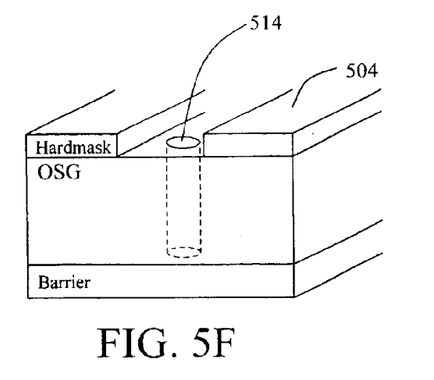

Referring to FIG. 5D there is shown the illustrative IC structure after adding another layer of photoresist 12 as described in process block 408. In FIG. 5E a via 514 is etched into the IC structure as described in block 410. FIG. 5F shows the IC structure after performing another $N_2O$ strip to remove the photoresist 512 as described in block 412.

Figure 5G:
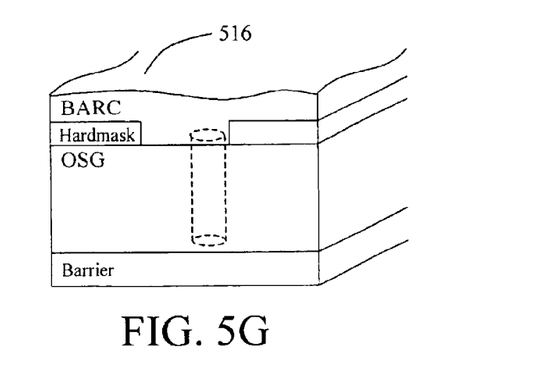
Figure 5H:
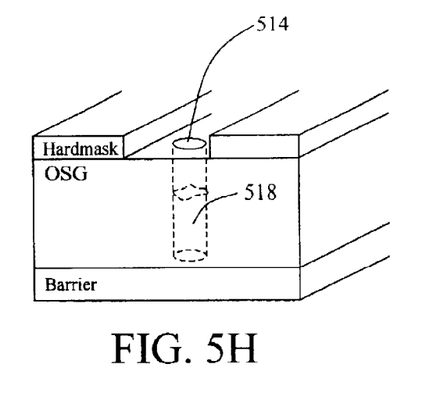
Figure 5I:
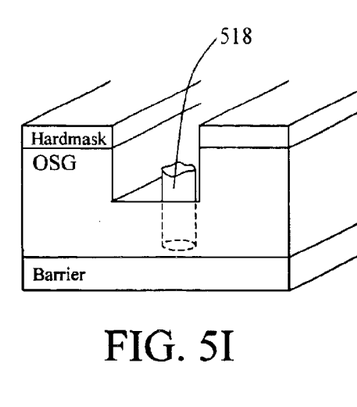
Figure 5J:
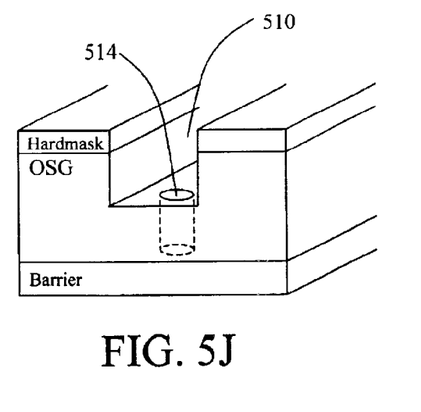

The organic plug is generated by first applying an organic material such as BARC 516 as described in block 414. The IC structure having the applied BARC 516 is shown in FIG. 5G. In FIG. 5H, there is shown the IC structure after $N_2O$ gas described in block 416 is used to etch back the BARC 516 to produce the desired organic plug 518. At FIG. 5I, the illustrative silicon containing dielectric material, i.e. OSG layer, has been trench etched to the desired depth as described in block 418. Finally, FIG. 5J shows the resulting IC structure with the desired trench 510 and via 514. The resulting IC structure is generated by applying the $N_2O$ plasma described in block 420 to remove the organic plug.

Although the description about contains many limitations in the specification, these should not be construed as limiting the scope of the claims but as merely providing illustrations of some of the presently preferred embodiments of this invention. Many other embodiments will be apparent to those of skill in the art upon reviewing the description. Thus, the scope of the invention should be determined by the appended claims, along with the full scope of equivalents to which such claims are entitled.

What is claimed is:

1. A method for generating an organic plug within a via, said via residing in an integrated circuit structure having a silicon containing dielectric material, said method comprising:

firstly, applying an organic compound to said IC structure, said organic compound configured to occupy said via and a surface of said IC;

secondly, feeding a nitrous oxide ($N_2O$) gas into a reactor;

thirdly, generating a plasma is said reactor; and fourthly, removing a portion of said organic compound so that said organic plug occupies said via.

2. The method of claim 1 wherein said organic compound is an antireflective coating (ARC).

3. The method of claim 1 wherein said organic compound is a bottom antireflective coating (BARC).

4. The method of claim 1 further comprising generating a gas mixture by mixing a diluent with said $N_2O$ gas, and applying said gas mixture to said reactor.

5. The method of claim 4 wherein said diluent is a noble gas.

6. The method of claim 1 wherein said method for generating said organic plug is applied during one of a plurality of steps performed during a dual damascene process.

7. The method of claim 1 wherein said silicon containing dielectric material is selected from a group consisting of organosilicate glass (OSG), silicon dioxide ($SiO_2$), and fluorinated silicate glass (FSG).

8. A method for generating an organic plug within a via, said via residing in an integrated circuit structure having a first photoresist layer, a second intermediate layer, and a third silicon containing dielectric layer, said method comprising:

firstly, applying an organic compound to said IC structure, said organic compound configured to occupy said via and a surface of said IC;

secondly, feeding a nitrous oxide ($N_2O$) gas into a reactor;

thirdly, generating a plasma is said reactor; and fourthly, removing a portion of said organic compound to generate said organic plug within said via.

9. The method of claim 8 wherein said organic compound is an antireflective coating (ARC).

10. The method of claim 8 wherein said organic compound is a bottom antireflective coating (BARC).

11. The method of claim 8 further comprising generating a gas mixture by mixing a diluent with said $N_2O$ gas, and applying said gas mixture to said reactor.

12. The method of claim 11 wherein said diluent is a noble gas.

13. The method of claim 8 wherein said method for generating said organic plug is applied during one of a plurality of steps performed during a dual damascene process.

14. The method of claim 8 wherein said silicon containing dielectric material is selected from a group consisting of organosilicate glass (OSG), silicon dioxide ($SiO_2$), and fluorinated silicate glass (FSG).

15. A method for generating an organic plug within a via, said via residing in an integrated circuit structure having a first photoresist layer, a second intermediate layer, and a third silicon containing dielectric layer, said method comprising:

firstly, applying an organic compound to said IC structure wherein said organic compound is a bottom antireflecting coating (BARC), said organic compound configured to occupy said via and a surface of said IC;

secondly, feeding a nitrous oxide ($N_2O$) gas into a reactor;

thirdly, generating a plasma is said reactor; and fourthly, removing a portion of said organic compound to generate said organic plug within said via.

16. The method of claim 15, further comprising generating a gas mixture by mixing a diluent with said $N_2O$ gas, and applying said gas mixture to said reactor.

17. The method of claim 16 wherein said diluent is a noble gas.

18. The method of claim 16 wherein said silicon containing dielectric material is selected from a group consisting of organosilicate glass (OSG), silicon dioxide ($SiO_2$), and fluorinated silicate glass (FSG).

19. The method of claim 18 wherein said method for generating said organic plug is applied during one of a plurality of steps performed during a dual damascene process.

* * * * *